United States Patent
Ma et al.

(10) Patent No.: US 7,867,786 B2
(45) Date of Patent: Jan. 11, 2011

(54) FERROELECTRIC LAYER WITH DOMAINS STABILIZED BY STRAIN

(75) Inventors: Qing Ma, San Jose, CA (US); Li-Peng Wang, San Jose, CA (US); Valluri Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 204 days.

(21) Appl. No.: 11/958,826

(22) Filed: Dec. 18, 2007

(65) Prior Publication Data

US 2009/0155931 A1 Jun. 18, 2009

(51) Int. Cl.
*H01L 21/00* (2006.01)
*H01L 21/02* (2006.01)
(52) U.S. Cl. ............ 438/3; 257/295; 257/E21.663; 257/E27.104
(58) Field of Classification Search ......... 438/3; 257/295, E21.663, E27.104
See application file for complete search history.

(56) References Cited

U.S. PATENT DOCUMENTS

| 6,747,357 | B2 * | 6/2004 | Lee et al. ............... 257/760 |
| 2007/0031590 | A1 * | 2/2007 | Baniecki et al. ............ 427/79 |
| 2007/0152253 | A1 * | 7/2007 | Lee et al. ............... 257/295 |

* cited by examiner

*Primary Examiner*—Ha Tran T Nguyen
*Assistant Examiner*—Aaron A Dehne
(74) *Attorney, Agent, or Firm*—Blakely, Sokoloff, Taylor & Zafman LLP

(57) ABSTRACT

The present invention describes a method including: providing a substrate; forming an underlying layer over the substrate; heating the substrate; forming a ferroelectric layer over the underlying layer, the ferroelectric layer having a thickness below a critical thickness, the underlying layer having a smaller lattice constant than the ferroelectric layer; cooling the substrate to room temperature; and inducing a compressive strain in the ferroelectric layer.

7 Claims, 1 Drawing Sheet

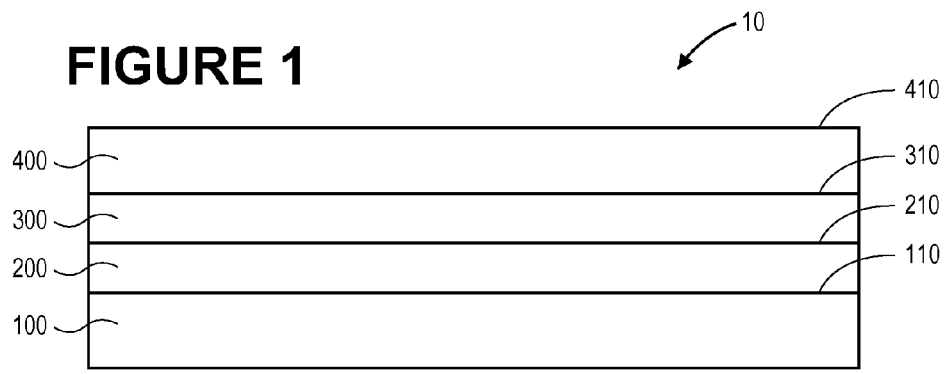
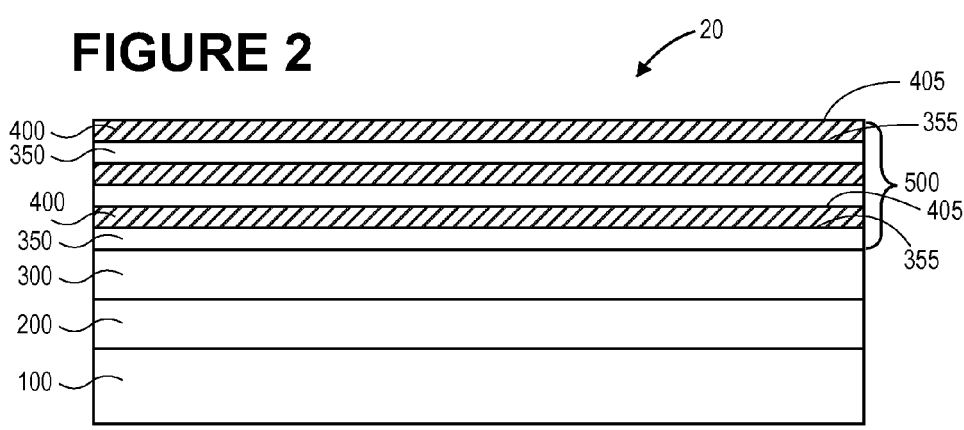
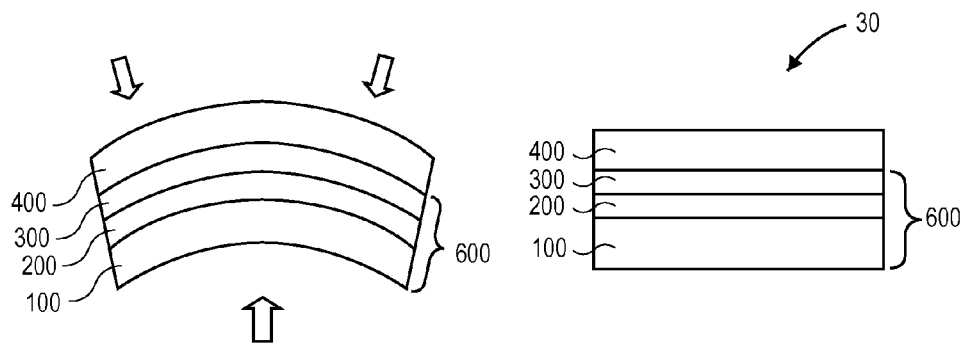

FERROELECTRIC LAYER WITH DOMAINS STABILIZED BY STRAIN

BACKGROUND OF THE INVENTION

1. Field of the Invention

The present invention relates to a field of semiconductor integrated circuit manufacturing, and more specifically, to a method of stabilizing domains in ferroelectric media.

2. Discussion of Related Art

A non-volatile memory (NVM) is a device that stores data and retains the data even when power has been interrupted. Most types of NVM involve accumulating charge, such as in a floating gate or in a capacitor. Writing or reading the charge may involve one or more transistors.

A new type of NVM involves a seek-and-scan approach analogous to a hard drive. The seek-and-scan approach does not rely on charge storage and thus is more scalable to a larger capacity.

However, the domains in the storage media associated with the seek-and-scan approach may not be stable.

BRIEF DESCRIPTION OF THE DRAWINGS

FIG. 1 is an illustration of an elevation view of a ferroelectric layer deposited on an underlying layer with a smaller lattice constant according to an embodiment of the present invention.

FIG. 2 is an illustration of an elevation view of a superlattice with thin ferroelectric layers separated by thin high-k dielectric layers with a smaller lattice constant according to an embodiment of the present invention.

FIG. 3 is an illustration of an elevation view of a ferroelectric layer deposited on a pre-strained substrate according to an embodiment of the present invention.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

Various embodiments of the present invention disclose storage media 10, 20, 30 with domains (not shown) stabilized by strain. Other embodiments of the present invention disclose methods of stabilizing domains in storage media 10, 20, 30, such as by strain. Still other embodiments of the present invention disclose methods of applying strain to storage media 10, 20, 30, such as to stabilize domains. Yet other embodiments of the present invention disclose methods of inducing strain in storage media 10, 20, 30, such as to stabilize domains. See FIGS. 1-3.

As shown in an embodiment of the present invention in FIG. 1, the storage media 10 includes a ferroelectric layer 400. As shown in another embodiment of the present invention in FIG. 2, the storage media 20 includes a superlattice 500. As shown in an embodiment of the present invention in FIG. 3, the storage media 10 includes a ferroelectric layer 400 on a pre-strained substrate 600.

In an embodiment of the present invention, the strain is compressive. In an embodiment of the present invention, the strain is elastic. In an embodiment of the present invention, the strain is elastic compressive.

First, as shown in an embodiment of the present invention in FIG. 1, a substrate 100 is provided. In order to allow integration with integrated circuit (IC) technology, the substrate 100 may include an elemental semiconductor, such as silicon, germanium, or diamond (form of carbon) or a compound semiconductor, including, but not limited to, silicon carbide (SiC), silicon germanium (SiGe), aluminum nitride (AlN), aluminum phosphide (AlP), gallium nitride (GaN), gallium arsenide (GaAs), indium phosphide (InP), zinc selenide (ZnSe), or cadmium telluride (CdTe).

As shown in an embodiment of the present invention in FIG. 1, a buffer layer 200 is formed over the substrate 100. In an embodiment of the present invention, the buffer layer 200 is located directly on a surface 110 of the substrate 100.

In an embodiment of the present invention, the buffer layer 200 includes a columnar structure. In an embodiment of the present invention, the buffer layer 200 includes a polycrystalline structure. In an embodiment of the present invention, the buffer layer 200 includes a single crystal structure.

In an embodiment of the present invention, the buffer layer 200 has a flat and smooth surface 210 without any faceting. The surface morphology may be characterized with an Atomic Force Microscope (AFM).

In an embodiment of the present invention, the buffer layer 200 includes a protective barrier. In an embodiment of the present invention, the buffer layer 200 includes a capping layer.

In an embodiment of the present invention, the buffer layer 200 prevents interdiffusion at an interface 110 with the underlying substrate 100 by serving as a diffusion barrier for atoms or ions into or out of the substrate 100.

In an embodiment of the present invention, the buffer layer 200 prevents oxidation at the interface 110 with the underlying substrate 100 by blocking oxygen or water. In an embodiment of the present invention, the buffer layer 200 is resistant to oxidation up to at least 600 degrees Centigrade.

In an embodiment of the present invention, the buffer layer 200 prevents reaction at the interface 110 with the underlying substrate 100 by having a low chemical reactivity with the substrate 100.

In an embodiment of the present invention, minimal interdiffusion or chemical reaction occurs at the interface 110 between the buffer layer 200 and the underlying substrate 100. In an embodiment of the present invention, the interface 110 between the buffer layer 200 and the underlying substrate 100 is thin, narrow, sharp, and abrupt, such as, with a transition zone of 2-4 nm. The interface morphology is observed with a Transmission Electron Microscope (TEM). The interface composition gradient is characterized with a secondary ion mass spectrometer (SIMS).

In an embodiment of the present invention, the buffer layer 200 is electrically insulating. In an embodiment of the present invention, the buffer layer 200 has a resistivity at room temperature (300 degrees Kelvin) of greater than (1.0E+3) ohm-cm. In an embodiment of the present invention, the buffer layer has a thickness to provide electrical insulation over the substrate 100 without leakage or breakdown.

In an embodiment of the present invention, the buffer layer 200 is electrically conducting. In an embodiment of the present invention, the buffer layer 200 has a resistivity at room temperature (300 degrees Kelvin) of (5.0E−5)-(1.0E−4) ohm-cm. In an embodiment of the present invention, the buffer layer 200 has a resistivity at room temperature (300 degrees Kelvin) of (1.0E−4)-(5.0E−3) ohm-cm.

In an embodiment of the present invention, the buffer layer 200 has a coefficient of thermal expansion (CTE) that is well-matched with the CTE of the underlying substrate 100. The layers 100, 200 that form or surround the interface 110 will not crack or delaminate even when heated or cooled rapidly if the constituent materials have similar CTE.

In an embodiment of the present invention, the buffer layer 200 is formed from a material that is tough and is thus resistant to cracking or fracturing.

In an embodiment of the present invention, the buffer layer 200 is formed from a material with high density, low internal stress, good adhesion, and high resistance to cracking or fracturing.

In an embodiment of the present invention, the buffer layer 200 is thin enough to prevent cracking but thick enough to provide complete physical coverage over a surface 110 of the substrate 100 without any void or pinhole.

In an embodiment of the present invention, the buffer layer 200 has a thickness selected from a range of 5-20 nm. In an embodiment of the present invention, the buffer layer 200 has a thickness selected from a range of 20-40 nm. In an embodiment of the present invention, the buffer layer 200 has a thickness selected from a range of 40-65 nm.

In an embodiment of the present invention, the buffer layer 200 includes a growth template layer. In an embodiment of the present invention, the buffer layer 200 orients growth of an overlying layer. In an embodiment of the present invention, the buffer layer 200 enhances crystallization of the overlying layer. In an embodiment of the present invention, the buffer layer 200 reduces a crystallization temperature of the overlying layer. In an embodiment of the present invention, the buffer layer 200 helps development and growth of grains in a microstructure of the overlying layer. In an embodiment of the present invention, the buffer layer 200 improves surface roughness and morphology of the overlying layer. In an embodiment of the present invention, the buffer layer 200 influences and improves ferroelectric properties of the overlying layer.

In an embodiment of the present invention, the overlying layer, with regards to a buffer layer 200, is a bottom electrode 300.

In an embodiment of the present invention, the buffer layer 200 is a single crystal film. In an embodiment of the present invention, the buffer layer 200 is formed epitaxially over the substrate 100. Epitaxy refers to a state or condition in which a deposited material 200 aligns to a crystallographic orientation of an underlying material 100.

In an embodiment of the present invention, the buffer layer 200 includes strontium titanate, $SrTiO_3$ (STO).

In an embodiment of the present invention, the buffer layer 200 is formed by a sol-gel process.

In an embodiment of the present invention, the buffer layer 200 is formed by metal-organic chemical vapor deposition (MOCVD), molecular beam epitaxy (MBE), or pulsed laser deposition (PLD).

In an embodiment of the present invention, the buffer layer 200 is formed at a low temperature. In an embodiment of the present invention, the buffer layer 200 is formed at a temperature selected from a range of 150-200 degrees Centigrade. In an embodiment of the present invention, the buffer layer 200 is formed at a temperature selected from a range of 200-275 degrees Centigrade.

In an embodiment of the present invention, the buffer layer 200 is formed at a moderate temperature. In an embodiment of the present invention, the buffer layer 200 is formed at a temperature selected from a range of 275-375 degrees Centigrade. In an embodiment of the present invention, the buffer layer 200 is formed at a temperature selected from a range of 375-500 degrees Centigrade.

In an embodiment of the present invention, the buffer layer 200 is formed at a high temperature. In an embodiment of the present invention, the buffer layer 200 is formed at a temperature selected from a range of 500-650 degrees Centigrade. In an embodiment of the present invention, the buffer layer 200 is formed at a temperature selected from a range of 650-825 degrees Centigrade.

In an embodiment of the present invention, the buffer layer 200 is formed with a deposition rate selected from a range of 3-6 nm. In an embodiment of the present invention, the buffer layer 200 is formed with a deposition rate selected from a range of 6-15 nm. In an embodiment of the present invention, the buffer layer 200 is formed with a deposition rate selected from a range of 15-45 nm.

A smaller grain size and a lower film deposition rate may result in a smoother surface.

In an embodiment of the present invention, the buffer layer 200 is not annealed.

In an embodiment of the present invention, the buffer layer 200 is annealed at a temperature selected from a range of 575-625 degrees Centigrade. In an embodiment of the present invention, the buffer layer 200 is annealed at a temperature selected from a range of 625-725 degrees Centigrade. In an embodiment of the present invention, the buffer layer 200 is annealed at a temperature selected from a range of 725-875 degrees Centigrade.

Next, a bottom electrode 300 is formed epitaxially over the buffer layer 200.

In an embodiment of the present invention, the bottom electrode 300 is located directly on a surface 210 of the buffer layer 200.

In an embodiment of the present invention, the bottom electrode 300 has a coefficient of thermal expansion (CTE) that is well-matched with the CTE of the underlying buffer layer 200. The layers 200, 300 that form or surround the interface 210 will not crack or delaminate even when heated or cooled rapidly if the constituent materials have similar CTE.

In an embodiment of the present invention, minimal interdiffusion or chemical reaction occurs at the interface 210 between the bottom electrode 300 and the underlying buffer layer 200. In an embodiment of the present invention, the interface 210 between the bottom electrode 300 and the underlying buffer layer 200 is thin, narrow, sharp, and abrupt, such as, with a transition zone of 2-4 nm.

In an embodiment of the present invention, the bottom electrode 300 includes a columnar structure. In an embodiment of the present invention, the bottom electrode 300 includes a polycrystalline structure. In an embodiment of the present invention, the bottom electrode 300 includes a crystalline structure.

In an embodiment of the present invention, the bottom electrode 300 has a flat and smooth surface 310 without any faceting.

In an embodiment of the present invention, the bottom electrode 300 includes an electrically conducting material. In an embodiment of the present invention, the electrically conducting material includes a metal, such as gold (Au). In an embodiment of the present invention, the electrically conducting material includes, but is not limited to, $SrRuO_3$ (or SRO) or $LaNiO_3$ (or LNO). The $LaNiO_3$ is an n-type metallic conductor at room temperature that has a lattice constant which matches well with the lattice constant of many ferroelectric perovskite oxides.

In an embodiment of the present invention, the bottom electrode 300 has a thickness selected from a range of 5-20 nm. In an embodiment of the present invention, the bottom electrode 300 has a thickness selected from a range of 20-70 nm. In an embodiment of the present invention, the bottom electrode 300 has a thickness selected from a range of 70-210 nm.

In an embodiment of the present invention, the bottom electrode 300 is a single crystal film. In an embodiment of the present invention, the bottom electrode 300 is formed epitaxially over the buffer layer 200. Epitaxy refers to a state or condition in which a deposited material 300 aligns to a crystallographic orientation of an underlying material 200.

Then, an electronically active layer is formed over the bottom electrode 300. The electronically active layer may include a conductor, a semiconductor, a superconductor, or a ferroelectric material.

In an embodiment of the present invention, the electronically active layer that is formed over the bottom electrode 300 includes a ferroelectric layer 400. Ferroelectricity refers to a characteristic in which a permanent electric dipole moment is controlled by an external electric field. Epitaxy enhances a dipole moment by aligning the dipoles.

In an embodiment of the present invention, the ferroelectric layer 400 has a large remanent polarization ($P_r$), a low coercive field, a low leakage current density, and a high fatigue resistance. In an embodiment of the present invention, a device formed with the ferroelectric layer 400 includes features, such as ease of writing, ease of erasing, scalability, and excellent signal-to-noise ratio (SNR).

In an embodiment of the present invention, the ferroelectric layer 400 has a coefficient of thermal expansion (CTE) that is well-matched with the CTE of the underlying bottom electrode 300. The layers 300, 400 that form or surround the interface 310 will not crack or delaminate even when heated or cooled rapidly if the constituent materials have similar CTE.

In an embodiment of the present invention, the ferroelectric layer 400 is formed epitaxially over an underlying layer, such as the bottom electrode 300. In an embodiment of the present invention, the ferroelectric layer 400 is formed epitaxially on the underlying layer, such as the bottom electrode 300, even though the lattice constants of the ferroelectric layer 400 and the underlying layer, such as the bottom electrode 300, are mismatched by 0.1-3.5%. In an embodiment of the present invention, the ferroelectric layer 400 is formed epitaxially on the underlying layer, such as the bottom electrode 300, even though the lattice constants of the ferroelectric layer 400 and the underlying layer, such as the bottom electrode 300, are mismatched by 3.5-7.5%. In an embodiment of the present invention, the ferroelectric layer 400 is formed epitaxially on the underlying layer, such as the bottom electrode 300, even though the lattice constants of the ferroelectric layer 400 and the underlying layer, such as the bottom electrode 300, are mismatched by 7.5-12.0%.

In an embodiment of the present invention, the ferroelectric layer 400 includes a lead titanate, $PbTiO_3$ (or PT).

In an embodiment of the present invention, the ferroelectric layer 400 includes a zirconium-modified lead titanate, $PbZr_xTi_{1-x}O_3$ (or PZT) simple solid solution.

The property of the PZT depends strongly on a compositional ratio of Zr/Ti that is selected. In an embodiment of the present invention, a tetragonal structure and a rhombohedral structure for the PZT coexist at a morphotropic phase boundary (MPB) when the Zr/Ti ratio approaches 52/48.

In an embodiment of the present invention, the PZT has a tetragonal structure when the Zr/Ti ratio is lower than 52/48 (Ti-rich). In an embodiment of the present invention, the Zr/Ti ratio is between 10/90 and 40/60. In an embodiment of the present invention, the Zr/Ti ratio is 20/80.

In an embodiment of the present invention, the PZT has a rhombohedral structure when the Zr/Ti ratio is higher than 52/48 (Zr-rich). In an embodiment of the present invention, the Zr/Ti ratio is between 60/40 and 80/20 which results in a higher switchable polarization and a more clearly defined switching voltage. In an embodiment of the present invention, the Zr/Ti ratio is 70/30.

In an embodiment of the present invention, the ferroelectric layer 400 includes a lanthanum-modified lead titanate, $Pb_xLa_{1-x}TiO_3$ (or PLT) simple solid solution.

In an embodiment of the present invention, the ferroelectric layer 400 includes a $Pb_{1-y}La_yZr_{1-x}Ti_xO_3$ (or PLZT) coupled solid solution.

In an embodiment of the present invention, the ferroelectric layer 400 includes a $SrBi_2Ta_2O_9$ (or SBT) layered perovskite.

In an embodiment of the present invention, the ferroelectric layer 400 includes a $Ba_xSr_{1-x}TiO_3$ (or BST).

In an embodiment of the present invention, the ferroelectric layer 400 includes a bismuth ferrite, $BiFeO_3$ (BFO). The ferroelectric property of a multiferroic BFO thin film is modified considerably by a magnetic field. In an embodiment of the present invention, a ratio of 1.1 Bi: 1.0 Fe for the BFO resulted in the best crystallinity and the best ferroelectric property.

In an embodiment of the present invention, the ferroelectric layer 400 includes bismuth ferrite and lead titanate, $BiFeO_3$—$PbTiO_3$ (BFPT).

In an embodiment of the present invention, the ferroelectric layer 400 includes a polycrystalline structure. In an embodiment of the present invention, the ferroelectric layer 400 has a grain size selected from a range of 8-20 nm. In an embodiment of the present invention, the ferroelectric layer 400 has a grain size selected from a range of 20-40 nm. In an embodiment of the present invention, the ferroelectric layer 400 has a grain size selected from a range of 40-60 nm.

In an embodiment of the present invention, the ferroelectric layer 400 includes a crystalline structure. A high density may be achieved by forming the ferroelectric layer 400 as a single-crystal film. In an embodiment of the present invention, the single crystal film has lower leakage current than a polycrystalline film. In an embodiment of the present invention, the single crystal film has less optical scattering than a polycrystalline film.

In an embodiment of the present invention, the ferroelectric layer 400 has a thickness selected from a range of 4-20 nm. In an embodiment of the present invention, the ferroelectric layer 400 has a thickness selected from a range of 20-80 nm. In an embodiment of the present invention, the ferroelectric layer 400 has a thickness selected from a range of 80-240 nm.

In an embodiment of the present invention, the ferroelectric layer 400 includes a single layer. In an embodiment of the present invention, the ferroelectric layer 400 is part of a dual layer. In an embodiment of the present invention, the ferroelectric layer 400 is part of a multilayer. In an embodiment of the present invention, the ferroelectric layer 400 is part of a superlattice 500 as shown in FIG. 2.

In an embodiment of the present invention, the ferroelectric film layer 400 is formed at a temperature selected from a range of 60-180 degrees Centigrade. In an embodiment of the present invention, the ferroelectric film layer 400 is formed at a temperature selected from a range of 180-450 degrees Centigrade. In an embodiment of the present invention, the ferroelectric film layer 400 is formed at a temperature selected from a range of 450-900 degrees Centigrade.

In an embodiment of the present invention, the ferroelectric layer 400 is subsequently annealed in an inert environment, such as argon. In an embodiment of the present invention, the ferroelectric layer 400 is subsequently annealed in an oxidizing environment, such as oxygen. In an embodiment of the present invention, the ferroelectric layer 400 is subsequently annealed in a nitridizing environment, such as nitrogen.

In an embodiment of the present invention, the ferroelectric layer 400 is annealed at a temperature selected from a range of 400-550 degrees Centigrade. In an embodiment of the present invention, the ferroelectric layer 400 is annealed at a temperature selected from a range of 550-750 degrees Centigrade. In an embodiment of the present invention, the ferroelectric layer 400 is annealed at a temperature selected from a range of 750-1,000 degrees Centigrade.

Depending on cation composition, oxygen content, and temperature, one or more crystallographic phases may be stable in the ferroelectric layer 400. In an embodiment of the present invention, the crystallographic phases may include orthorhombic, rhombohedral, or monoclinic symmetry.

The structural properties of a single-crystal thin film or layer is characterized by in situ reflection high-energy electron diffraction (RHEED) and x-ray diffraction (XRD). The chemical composition and thickness of the thin film is determined by wavelength dispersive spectroscopy (WDS). The thickness may also be determined by Rutherford backscattering spectroscopy (RBS) or a profilometer.

In an embodiment of the present invention, a probe-based storage system may include a movable x-y stage, a multiple conductive cantilever probe array, and a data signal processing module. The probe-based storage system is not limited by photolithography. Instead, the storage density depends on a bit size that is defined by probe technology and storage media material properties. The probe or the media will move physically so an initial latency is high.

The probe-based storage system may include a seek-and-scan probe (SSP). The SSP includes a microelectromechanical system (MEMS) with transducers, sensors, and actuators. The track pitch and position of the multiple probes in the array are determined by nano-positioning. The tip scaling is determined by tip field focusing. In an embodiment of the present invention, the probe tip has a radius of 20 nm. In an embodiment of the present invention, the probe tip has a radius of 12 nm. In an embodiment of the present invention, the probe tip has a radius of 7nm.

A short voltage pulse is applied between the bottom electrode 300 and the probe tip while scanning a surface 410 of the storage media, such as the ferroelectric layer 400. The voltage pulse applied to the probe tip will initiate a local switching of domains in the storage media, such as the ferroelectric layer 400.

The voltage pulse writes a domain in the storage media, such as the ferroelectric layer 400, with a pattern of a one-dimensional feature, such as a dot, or a two-dimensional feature, such as a line. In an embodiment of the present invention, the polarization is in-plane. In an embodiment of the present invention, the polarization is out-of-plane.

A sign of the voltage pulse determines whether a polarization vector points from or to a plane of the ferroelectric layer 400. The polarization direction in the ferroelectric layer 400 may be sensed and read back by using a very low voltage.

The voltage pulse duration, voltage amplitude, and storage media, such as the ferroelectric layer 400, thickness may be optimized to achieve a high areal density for the SSP.

In an embodiment of the present invention, the areal density of the storage media, such as the ferroelectric layer, 400 of the SSP is greater than 1.0 Terabit per square inch (Tbit/in$^2$). In an embodiment of the present invention, the areal density of the storage media, such as the ferroelectric layer, 400 of the SSP is greater than 3.0 Tbit/in$^2$. In an embodiment of the present invention, the areal density of the storage media, such as the ferroelectric layer, 400 of the SSP is greater than 10.0 Tbit/in$^2$.

A shorter voltage pulse duration will result in a smaller domain and a higher data storage density. In an embodiment of the present invention, the voltage pulse has a duration of less than 1E-7 second. In an embodiment of the present invention, the voltage pulse has a duration of less than 1E-8 second. In an embodiment of the present invention, the voltage pulse has a duration of less than 1E-9 second (nanosecond).

A thinner storage media, such as the ferroelectric layer, 400 will result in a smaller domain and a higher data storage density. In an embodiment of the present invention, the individual domain has a size selected from a range of 20-50 nm. In an embodiment of the present invention, the individual domain has a size selected from a range of 8-20 nm. In an embodiment of the present invention, the individual domain has a size selected from a range of 3-8 nm.

In an embodiment of the present invention, a domain wall in the storage media, such as the ferroelectric layer, 400 has a thickness on the order of a few lattices. In an embodiment of the present invention, the domain wall has a thickness of less than 5 nm. In an embodiment of the present invention, the domain wall has a thickness of less than 1 nm.

The domain in the storage media, such as the ferroelectric layer, 400 may grow or shrink in size. When the domain size is smaller than about 20 nm, polarization retention may be affected and domain stability may be degraded. A speed of domain wall motion is related to an energy barrier that is associated with dipole flipping.

In an embodiment of the present invention, an elastic compressive strain is applied to the storage media, such as the ferroelectric layer 400, to increase a Curie temperature. In an embodiment of the present invention, the elastic compressive strain is applied to the storage media, such as the ferroelectric layer 400, to increase an energy barrier for dipole flipping. Raising the energy barrier for dipole flipping will improve the domain stability in the storage media, such as the ferroelectric layer 400.

In an embodiment of the present invention, the strain, such as the elastic compressive strain, is engineered and incorporated into the ferroelectric layer 400 to stabilize the domains.

In an embodiment of the present invention, the strain, such as the elastic compressive strain, is induced internally within the ferroelectric layer 400. In an embodiment of the present invention, the strain results from a dopant that is too large to fit in a lattice. In an embodiment of the present invention, the strain results from a dopant that is too small to fit in a lattice.

In an embodiment of the present invention, the ferroelectric layer 400 has substitutional dopants in the lattice. In an embodiment of the present invention, the ferroelectric layer 400 has interstitial dopants in the lattice. In an embodiment of the present invention, the ferroelectric layer 400 has defects in the lattice. In an embodiment of the present invention, the ferroelectric layer 400 has substitutional vacancies in the lattice. In an embodiment of the present invention, the ferroelectric layer 400 has interstitial voids in the lattice.

In an embodiment of the present invention, the strain, such as the elastic compressive strain, is applied from externally to the ferroelectric layer 400. In an embodiment of the present invention, the ferroelectric layer 400 has an underlying layer, such as a bottom electrode 300, to apply the elastic compressive strain. In an embodiment of the present invention, the ferroelectric layer 400 has an overlying layer (not shown) to apply the elastic compressive strain.

In an embodiment of the present invention, the strain in the ferroelectric layer 400 depends upon the formation, deposition, growth, anneal, or highest encountered temperature. In an embodiment of the present invention, if the ferroelectric layer 400 is below a minimum, or critical, thickness, the built-in elastic strain at the deposition temperature depends upon the extent of lattice mismatch, if present. In an embodiment of the present invention, if the ferroelectric layer 400 is above the critical thickness, the built-in elastic strain at the deposition temperature depends upon partial relaxation, such as to the native lattice constants. In an embodiment of the present invention, especially if the ferroelectric layer 400 is above the critical thickness, the built-in elastic strain may be partially or entirely relieved by formation of dislocations.

In an embodiment of the present invention, if there is a mismatch in the CTE between the ferroelectric layer 400 and the underlying layer, such as the bottom electrode 300, an elastic strain will develop while cooling down to room temperature. If the underlying layer is silicon, the thermal expansion term is usually positive (tensile) because the CTE of silicon is smaller than the CTE of almost all important ferroelectric materials which are presently known.

In an embodiment of the present invention as shown in FIG. 1, the storage media 10 includes the ferroelectric layer 400 that is deposited below the critical thickness and on an underlying layer, such as the bottom electrode layer 300, which is selected to have a smaller lattice constant. After cooling to room temperature, the mismatch with the lattice of the underlying layer, such as the bottom electrode layer 300, would continue to apply a compressive strain in the ferroelectric layer 400.

In an embodiment of the present invention as shown in FIG. 2, the storage media 20 includes a composite material 500.

In an embodiment of the present invention as shown in FIG. 2, the storage media 20 includes a layered composite material 500, such as ferroelectric material 400 interleaved with a high dielectric constant (k) dielectric material 350 with a smaller lattice constant than the ferroelectric material 400.

In an embodiment of the present invention as shown in FIG. 2, the storage media 20 includes a periodic layered composite material 500, such as ferroelectric material 400 separated by a high-k dielectric 350 with a smaller lattice constant than the ferroelectric material 400.

In an embodiment of the present invention as shown in FIG. 2, the storage media 20 includes a superlattice 500. In an embodiment of the present invention, the superlattice 500 includes two components. In an embodiment of the present invention, the superlattice 500 includes three components.

A period is a repeating unit. In an embodiment of the present invention, the period of the superlattice 500 is a bilayer that includes one layer of ferroelectric material 400 and one layer of high-k dielectric 350. In an embodiment of the present invention, the period of the superlattice 500 is a trilayer.

In an embodiment of the present invention, the superlattice 500 has 3-9 periods. In an embodiment of the present invention, the superlattice 500 has 10-24 periods. In an embodiment of the present invention, the superlattice 500 has 25-49 periods.

After cooling to room temperature, the mismatch with the lattice of the high-k dielectric material 350 would result in application of a compressive strain to the alternating layers of ferroelectric material 400. The strain in the superlattice 500 may result in a substantial polarization enhancement.

In an embodiment of the present invention as shown in FIG. 2, the layer of ferroelectric material 400 has a thickness of 3-9 nm. In an embodiment of the present invention, the layer of ferroelectric material 400 has a thickness of 9-22 nm. In an embodiment of the present invention, the layer of ferroelectric material 400 has a thickness of 22-45 nm.

In an embodiment of the present invention, it is critical to accurately maintain a periodicity of the superlattice 500, especially when the thickness of the ferroelectric layer 400 is less than 30 nm.

In an embodiment of the present invention, it is critical to minimize an interfacial roughness within the superlattice 500. In an embodiment of the present invention, the interfacial roughness should be less than 25% of the thickness of the thinner layer forming the interface.

In an embodiment of the present invention, the interfacial roughness 355 is above the high-k dielectric 350 and below the ferroelectric layer 400. In an embodiment of the present invention, the interfacial roughness 405 is above the ferroelectric layer 400 and below the high-k dielectric 350.

In an embodiment of the present invention, the interfacial roughness 355 is similar to the interfacial roughness 405. In another embodiment of the present invention, the interfacial roughness 355 is different from the interfacial roughness 405.

In an embodiment of the present invention, the thickness ratio of the ferroelectric material 400 to the high-k dielectric 350 is selected from a range of 4:1-2:1. In an embodiment of the present invention, the thickness ratio of the ferroelectric material 400 to the high-k dielectric 350 is selected from a range of 1:1-1:3.

In an embodiment of the present invention, the superlattice 500 has a dielectric constant (k) selected from a range of 15-75. In an embodiment of the present invention, the superlattice 500 has a dielectric constant (k) selected from a range of 75-300. In an embodiment of the present invention, the superlattice 500 has a dielectric constant (k) selected from a range of 300-900.

In an embodiment of the present invention as shown in FIG. 3, the ferroelectric layer 400 is deposited onto an underlying substrate 600, such as including the bottom electrode 300, that is pre-strained with a tensile stress. In an embodiment of the present invention, pre-straining may be accomplished by keeping the underlying layer, such as the bottom electrode 300, elastically bent or elastically warped to temporarily expand its lattice during a deposition of the ferroelectric layer 400. The underlying layer is then released from the elastic bending or warping after the ferroelectric layer 400 has been deposited and has cooled down to room temperature. The resulting in-plane compressive strain in the ferroelectric layer 400 is sufficient to bring the total elastic strain at room temperature to compressive. In an embodiment of the present invention, an a-axis is shortened and a c-axis is elongated.

Another embodiment of the present invention as shown in FIG. 1 discloses storage media 10, such as including the ferroelectric layer 400, having domains (not shown) stabilized by an elastic compressive strain. In an embodiment of the present invention, the ferroelectric layer 400 has a high Curie temperature due to the elastic compressive strain so the domains are stable. In an embodiment of the present invention, the ferroelectric layer 400 has a high energy barrier for dipole flipping due to the elastic compressive strain so the domains are stable.

Still another embodiment of the present invention as shown in FIG. 1 discloses storage media 10, such as including the epitaxial ferroelectric layer 400 located over the underlying layer, such as the bottom electrode 300, having a smaller lattice constant.

Yet another embodiment of the present invention as shown in FIG. 1 discloses storage media 10, such as including the epitaxial ferroelectric layer 400 located over an underlying layer, such as the bottom electrode 300, which exerts a compressive strain.

A further embodiment of the present invention as shown in FIG. 2 discloses storage media 20, such as including a superlattice 500 in which a mismatch in lattice constant with the high-k dielectric 350 results in a compressive strain in the ferroelectric layers 400 between the high-k dielectric.

Still another embodiment of the present invention as shown in FIG. 3, discloses storage media 30, such as including a ferroelectric layer 400 located over an underlying substrate 600 that is pre-strained before formation of the dielectric layer 400 and subsequently released.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

We claim:

1. A method of stabilizing domains within a ferroelectric material layer, comprising:
    providing a silicon substrate;
    forming an underlying layer over said silicon substrate;
    heating said silicon substrate to a deposition temperature in a range of 450-900° C.;
    epitaxially forming a ferroelectric layer over said underlying layer, said ferroelectric layer having a thickness below a critical thickness, said underlying layer having a smaller lattice constant than said ferroelectric layer, wherein the lattice constants are mismatched by 3.5% to 7.5% and the mismatch in lattice constants cause compressive strain to the layer of ferroelectric material; and
    cooling said substrate to room temperature to room temperature to stabilize the domains by applying an in-plane elastic compressive strain in the ferroelectric layer at room temperature.

2. The method of claim 1 wherein said underlying layer comprises a bottom electrode layer of SRO.

3. The method of claim 1, wherein said domain has a size smaller than 20 nm.

4. A method of stabilizing domains within a ferroelectric material layer, comprising:
    providing an underlying layer comprising a silicon substrate;
    heating said underlying layer to a deposition temperature in a range of 450-900° C.;
    forming a superlattice over the underlying layer at the deposition temperature by epitaxially forming a first layer of a ferroelectric material with a thickness below the critical thickness and then forming alternating layers of a high dielectric constant material and the ferroelectric material, wherein at least the high dielectric constant material has a smaller lattice constant than said ferroelectric material; and
    cooling said underlying layer to room temperature to stabilize the domains by applying an in-plane elastic compressive strain in the alternating layers of ferroelectric material at room temperature.

5. The method of claim 4 wherein said underlying layer comprises a bottom electrode layer having a smaller lattice constant than the ferroelectric material is disposed over the silicon substrate, and wherein the first layer of ferroelectric material is lattice mismatched with the bottom electrode layer by 7.5% and 12%.

6. The method of claim 4 wherein said domain has a size smaller than 20 nm.

7. The method of claim 4, wherein the underlying layer comprises a bottom electrode of SRO.

* * * * *